(12) United States Patent
Worley

(10) Patent No.: US 11,444,455 B2
(45) Date of Patent: Sep. 13, 2022

(54) INTEGRATED CIRCUIT PROTECTION

(71) Applicant: Eugene Robert Worley, Irvine, CA (US)

(72) Inventor: Eugene Robert Worley, Irvine, CA (US)

( * ) Notice: Subject to any disclaimer, the term of this patent is extended or adjusted under 35 U.S.C. 154(b) by 174 days.

(21) Appl. No.: 16/873,112

(22) Filed: Feb. 3, 2020

(65) Prior Publication Data

US 2020/0259326 A1 Aug. 13, 2020

Related U.S. Application Data

(60) Provisional application No. 62/803,465, filed on Feb. 9, 2019.

(51) Int. Cl.
| | | |
|---|---|---|
| *H02H 9/04* | (2006.01) | |
| *H01L 27/02* | (2006.01) | |
| *H01L 29/8605* | (2006.01) | |
| *H01L 29/866* | (2006.01) | |

(52) U.S. Cl.
CPC ......... *H02H 9/046* (2013.01); *H01L 27/0255* (2013.01); *H01L 27/0259* (2013.01); *H01L 27/0262* (2013.01); *H01L 29/8605* (2013.01); *H01L 29/866* (2013.01)

(58) Field of Classification Search
CPC . H02H 9/046; H01L 27/0255; H01L 27/0259; H01L 27/0262; H01L 29/8605; H01L 29/866; H01L 27/0288
USPC .......................................................... 361/56
See application file for complete search history.

(56) References Cited

U.S. PATENT DOCUMENTS

| | | | |
|---|---|---|---|
| 8,254,071 B2 | 8/2012 | Dunnihoo et al. | |
| 9,601,920 B2 | 3/2017 | Glas et al. | |
| 2005/0275029 A1* | 12/2005 | Watt .......................... | H01L 29/87 257/355 |
| 2008/0042241 A1* | 2/2008 | Chiang ............. | H01L 29/66166 257/E27.047 |
| 2016/0241023 A1* | 8/2016 | Bentley ................... | H02H 9/025 |

* cited by examiner

*Primary Examiner* — Dharti H Patel

(57) ABSTRACT

In certain aspects of the disclosure, a protection circuit includes a first input/output (I/O) pin, a second I/O pad, a shunt clamp coupled to the first I/O pad, and a resistor coupled between the shunt clamp and the second I/O pad. The resistor has a first dynamic resistance at a voltage of 100 millivolts across the resistor, the resistor has a second dynamic resistance at a voltage of three volts across the resistor, and the second dynamic resistance is at least five times greater than the first dynamic resistance.

16 Claims, 20 Drawing Sheets

INTEGRATED CIRCUIT PROTECTION

RELATED APPLICATION

The present application claims the benefit, under 35 U.S.C. 119(e), of U.S. Provisional Application No. 62/803,465, filed on Feb. 9, 2019, the entire specification of which is incorporated herein by reference.

BACKGROUND

Field

Aspects of the present disclosure relate generally to protecting integrated circuits from electrostatic discharge (ESD).

Background

Protection circuits are used to protect integrated circuits from damage due to electrostatic discharge (ESD). A protection circuit may include a shunt clamp that protects an integrated circuit during an ESD event by shunting the energy of the ESD away from the integrated circuit. Examples of shunt clamps include silicon controlled rectifiers (SCRs), Zener diodes, and snap-back bipolar transistors.

SUMMARY

A first aspect relates to a system. The system includes a shunt clamp, an integrated circuit, and a resistor coupled between the shunt clamp and the integrated circuit. The resistor has a first dynamic resistance at a voltage of 100 millivolts across the resistor, the resistor has a second dynamic resistance at a voltage of three volts across the resistor, and the second dynamic resistance is at least five times greater than the first dynamic resistance.

A second aspect relates to a protection circuit. The protection circuit includes a first input/output (I/O) pin, a second I/O pad, a shunt clamp coupled to the first I/O pad, and a resistor coupled between the shunt clamp and the second I/O pad. The resistor has a first dynamic resistance at a voltage of 100 millivolts across the resistor, the resistor has a second dynamic resistance at a voltage of three volts across the resistor, and the second dynamic resistance is at least five times greater than the first dynamic resistance.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Aspects of the present disclosure are directed to preventing system level ESD from damaging the Input/Outputs (I/Os) of integrated circuits that are coupled to connectors or pins that are exposed to electrostatic discharges. By way of example, cell phones, lap top, personal computers, TVs, music players and other devices have connectors for coupling integrated circuits (e.g., processors) in the devices to SIM cards, flash memory cards, USB, HDMI, added dynamic main memory, headphones, and/or chargers. These connectors are exposed to handling electrostatic discharges which can damage the I/Os of integrated circuits coupled to the connectors. The trend in the integrated circuit (IC) industry is to connect the aforementioned I/Os directly to a system on a chip (SOC) IC. SOC ICs are typically fabricated with state-of-the-art processes such as FINFET technology making the silicon chip real estate very expensive. Too expensive, in most cases, to put large ESD energy absorbing clamps on the SOC chip.

System level ESD discharge energy is large and should be dissipated without damaging the chip. Because it is not economically feasible to put high ESD energy absorbing clamps on the SOC chip, external ESD energy absorbing chips are commonly used. These ESD energy absorbing chips are made using simpler processes with large geometries making the silicon real estate much cheaper than the SOC real estate. These chips may be referred to as transient voltage suppressors (TSVs) or International Electrotechnical Commission (IEC) clamps. A significant problem with a TSV is its ability to a shunt high current while keeping the voltage drop across the TSV low enough to protect the functional chip or SOC. Aspects of the present disclosure address this problem by introducing a non-linear series resistor, as discussed further below.

Figure 1:
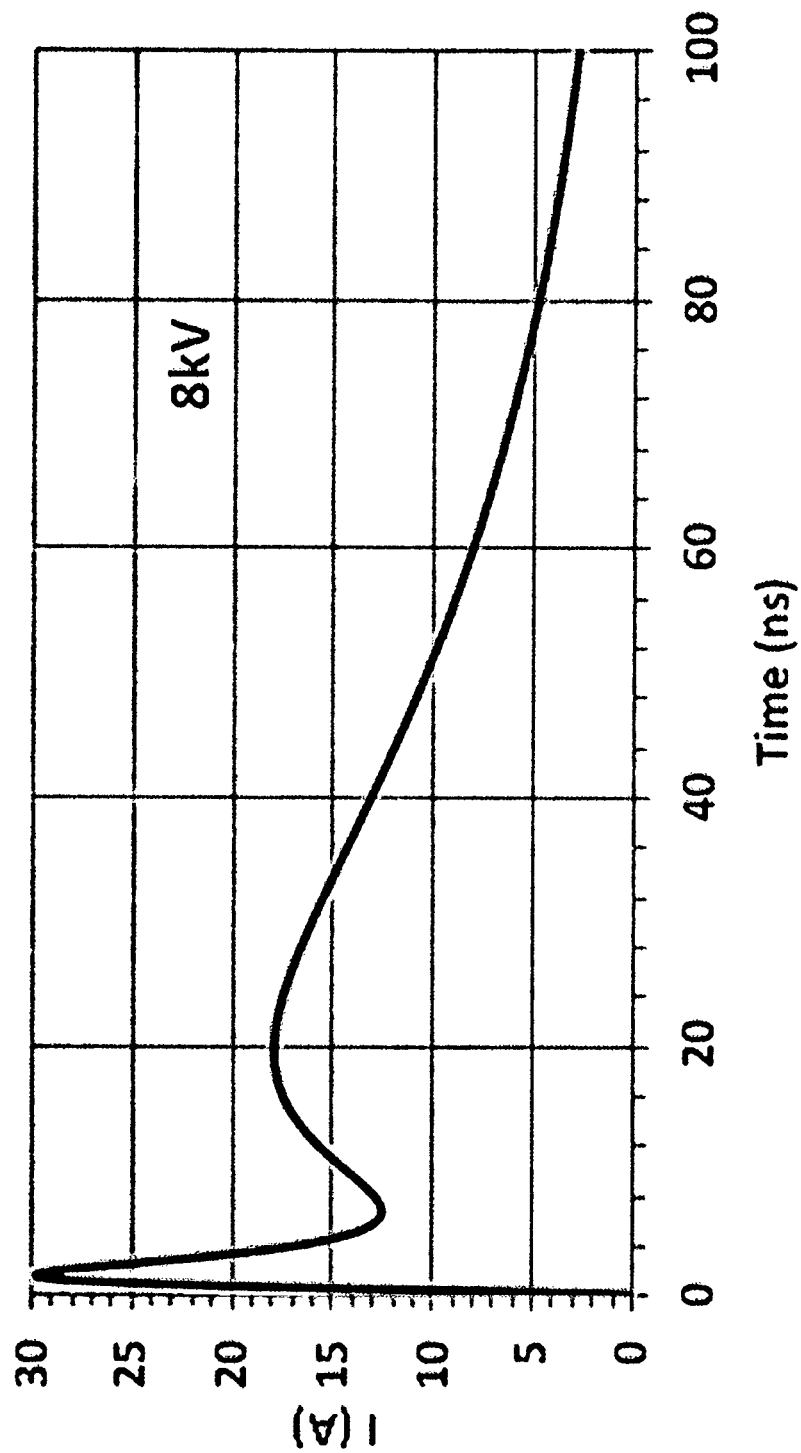
FIG. 1 shows an exemplary current waveform of an 8 kV calibration discharge into a measurement target according to an ICE specification, level 4.

A common ESD test standard used to certify external I/O connectors against system level ESD is IEC-64000-4-2. In this standard, an ESD "gun" is used to inject a specified current waveform into the connectors of a product. The product must be able to survive the discharges from this gun into its system without damage or an un-recoverable logic upset. The gun discharge source is a 150 pF capacitor charged up to a specified voltage and then discharged into the system or Equipment Under Test (EUT) through a 330Ω resistor. FIG. 1 shows a current calibration waveform plot of the International Electrotechnical Commission (IEC) specified contact discharge into a target at 8 kV which is a level 4 specification. The initial current peak is due to the gun to horizontal coupling plane (HCP) capacitance while the rest of the waveform is mostly due to the 150 pF capacitor and the 330Ω series resistor along with some parasitic series inductance.

SOC and regular IC parts have a much smaller level of ESD energy absorbing capability related to product assembly handling as opposed to system level ESD. This ESD spec requires a much lower level of current shunting in order to keep the pin voltage of the part below the failure threshold for the assembly handling. For example, for a 1 kV Human Body Model (HBM) discharge the peak current is about 0.667 A. 1 kV is the recommended target found on page 35 of the JEDEC JEP155B standard document. For the IEC level 4 test (8 kV contact) performed at the system level the peak current can be as high as 30 A as shown in FIG. 1. The energy that must be absorbed by a level 4 IEC discharge is 589 times the energy for an HBM 1 kV test after 100 ns of discharge time. Thus, for a protected part or chip the external clamp must absorb most of the IEC discharge energy while keeping the protected part's pin below its failure voltage. Only a small portion of the IEC discharge can be absorbed by the part's internal ESD protection circuit without failure.

A significant problem with using a TVS clamp is that the voltage drop across the TVS clamp during an IEC ESD discharge tends to be too high to protect modern small geometry integrated circuits. For example, at a peak current of 30 A a clamp resistance of 0.5Ω will drop 15V which is much too high for integrated circuit I/Os. Achieving lower resistances becomes increasingly difficult. Aspect of the present disclosure allow larger voltage drops across the TVS clamp by inserting a non-linear resistor between the TVS clamp and the integrated circuit I/O. The non-linear resistor has little to no impact on the normal operation of the integrated circuit I/O and absorbs the voltage and current between the TVS clamp and the integrated circuit I/O preventing damage to the I/O.

Figure 2A:
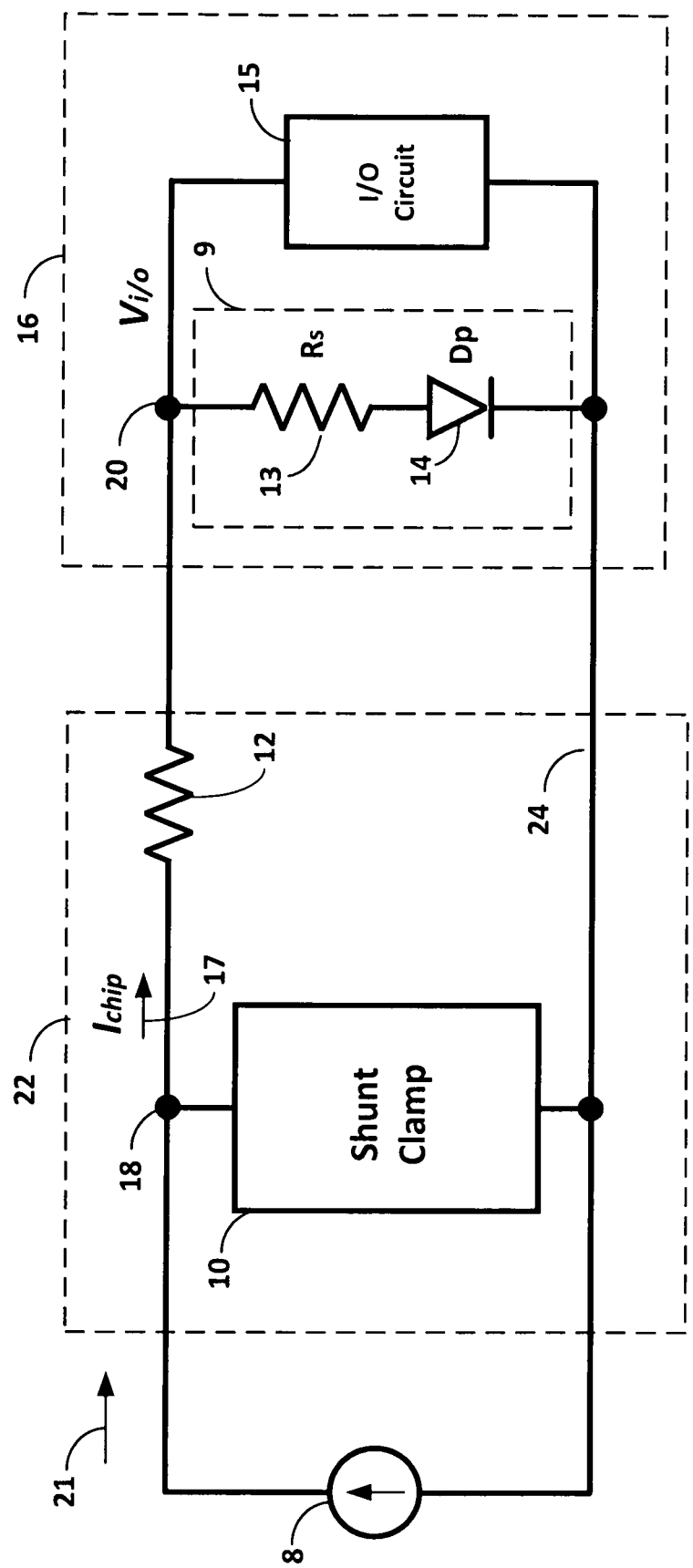
FIG. 2A shows example of a protection circuit including a shunt clamp and a resistor according to certain aspects of the present disclosure.

The FIG. 2A shows a schematic diagram of a chip 16 including a I/O circuit 15, and an external chip 22 including a protection circuit. The protection circuit includes a shunt clamp 10 (e.g., TVS clamp) and a non-linear resistor 12 coupled between the shunt clamp 10 and the I/O circuit 15. The shunt clamp 10 may include an SCR, a snap-back bipolar transistor, a Zener diode and/or another type of shunt clamp. The I/O circuit 15 may provide an I/O interface for a processor and/or a memory (not shown in FIG. 2A) integrated on the chip 16. In this respect, the I/O circuit 15 functions as an integrated circuit I/O.

The chip 16 also includes an internal ESD clamp 9 to protect the I/O circuit 15 from ESD. In the example in FIG. 2A, the internal ESD clamp 9 includes a diode 14 which includes parasitic series resistance 13. The diode 14 is used to protect the I/O circuit 15 to a very low ESD level during assembly. In this example, it is assumed that the diode's 14 cathode is effectively shunted to Vss 24 or ground through a large Vdd-Vss bypass capacitor (not shown) with a capacitance of approximately 1 uF.

During normal operation of the I/O circuit 15, the shunt clamp 10 has a high impedance (i.e., very low leakage current less than one μA) so as not to interfere with normal operation of the I/O circuit 15. The shunt clamp 10 is triggered by a high voltage transient due to an ESD event. Once triggered, the shunt clamp 10 shunts transient current to ground 24 to protect the I/O circuit 15.

During normal operation of the I/O circuit 15, the non-linear resistor 12 has a low resistance so as not to interfere with normal operation of the I/O circuit 15. During an ESD event, the resistance of the resistor 12 significantly increases from the resistance during normal operation (e.g., by a factor of at least 5) to limit the current flowing into the chip 16 and limit the voltage at the chip 16 to a voltage below the failure threshold of the chip 16, as discussed further below.

Figure 2B:
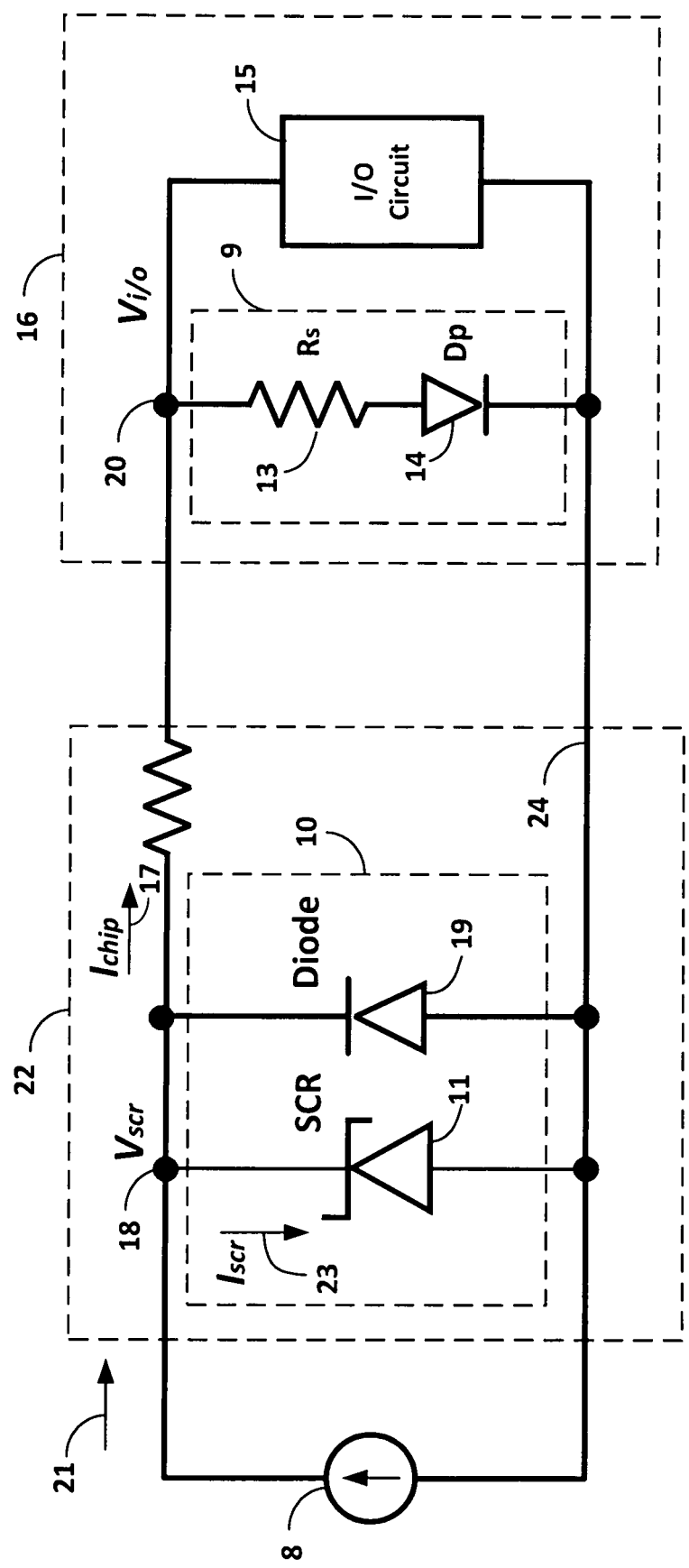
FIG. 2B shows an example in which the shunt clamp includes a silicon controlled rectifier (SCR) according to certain aspects of the present disclosure.

FIG. 2B shows an example in which the shunt clamp 10 includes a SCR 11 that shunts positive current. In this example, the sunt clamp 10 also includes a reverse diode 19 to shunt negative current. The reverse or negative current direction could also be shunted by an SCR, snap-back bipolar transistor or a Zener diode.

For engineering purposes, a Transmission Line Pulser (TLP) is used to characterize ESD circuits by generating pulsed I-V curves. The TLP generates a rectangular pulse with currents ranging as high as several tens of amps. The standard pulse width is 100 ns which is within the time-energy domain of both the Human Body Model (HBM) test used for assembly ESD standard qualification and IEC pulses used for product level ESD tests. The current and voltage are sampled at the top of rectangular pulse.

Figure 3:
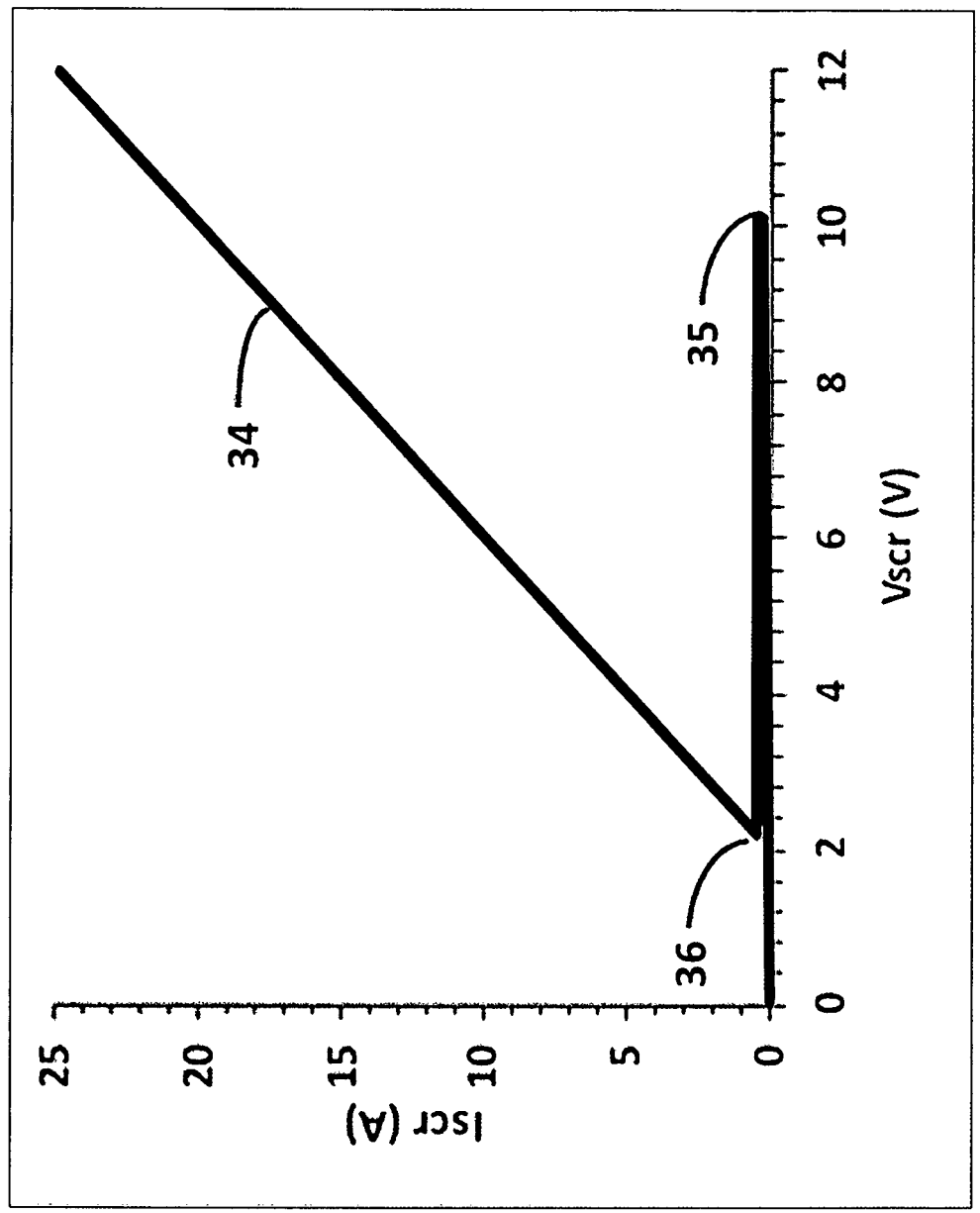
FIG. 3 shows an exemplary transmission line pulser (TLP) current-voltage (I-V) plot of an SCR.

FIG. 3 shows an example of a TLP I-V plot of an external clamp SCR (e.g., SCR 11). In this example, the SCR is in the off state until the trigger voltage 35 is reached at about 10V. After triggering the SCR, the voltage drops to the holding voltage 36 which is 2.1V. After triggering, the current 34 is roughly linear with voltage and has a low "on" resistance value of 0.4Ω for this example. For a 30 A pulse and the SCR triggered into the "on" state, the voltage drop across the SCR is 0.4Ω×30 A+2.1V or 14.1V. Although an SCR is shown here, a snap-back NPN bipolar transistor or a Zener diode could have been used or any high current, low voltage shunt clamp.

For simplicity, a contact discharge waveform energy conversion factor of 12 A TLP/8 kV IEC will be assumed. That is, an 8 kV IEC calibration contact discharge is equivalent in energy after 100 ns to a 12 A, 100 ns TLP discharge.

A typical I/O circuit (e.g., I/O circuit 15) will now be analyzed with respect to IEC discharge tolerance in which benefits of aspects of the present disclosure will be demonstrated. In the example in FIG. 2B, the shunt clamp 10 is implemented with the SCR 11 and the reverse diode 19. However, it to be appreciated that the shunt clamp 10 may be implemented with a snap-back bipolar transistor, a Zener diode and/or any other high current clamp device. Typical component values will be assumed. The SCR whose characteristics are shown in FIG. 3 will be used in the analysis assuming a positive discharge current and a shunt current conduction 23 through SCR 11. The internal ESD clamp 9 includes a parasitic resistance 13 with a value of 2.5Ω and, in series with a pad ESD protection, a diode Dp 14 with a high current offset voltage of 1.2V, and the I/O circuit 15 which has an ESD failure voltage, generally several volts. The analysis is carried out for three cases. In the first case, a resistor with a resistance of zero ohms is used to represent a no resistor case. In the second case, a linear resistor with a resistance of 1.25Ω is coupled between shunt clamp 10 and the chip 16 to represent a linear resistor case. In the third case, the non-linear resistor 12 is used, in which the non-linear resistor 12 is implemented with a velocity saturation resistor. In this example, the resistor 12 has a resistance approximately equal to 1.25Ω Under normal operating conditions of the I/O circuit 15 (e.g., a current of less than 100 milliamperes flowing into the chip 16). As the voltage across the non-linear resistor 12 increases, the non-linear resistor 12 enters a velocity saturation region in which velocity saturation of carriers in the non-linear resistor 12 causes the resistance of the non-linear resistor 12 to greatly increase (e.g., tenfold or greater increase from 1.25Ω). In contrast, the resistance of the linear resistor for the second case remains fixed at 1.25Ω.

For the analysis, it is also assumed that the rating of the "on" chip HBM ESD protection circuit consisting of the diode Dp 14 and resistor 13 is 1 kV per JEDEC JEP 157. This spec requires that the circuit pass a worst case 100 ns TLP current of 0.667 A for a peak based failure current. Thus, if the TLP current reaches 0.667 A it will be assumed that the I/O circuit 15 will become damaged. Also, at 12 A TLP the current 23 will be equivalent in damaging energy to an IEC 8 kV contact discharge.

Figure 4:
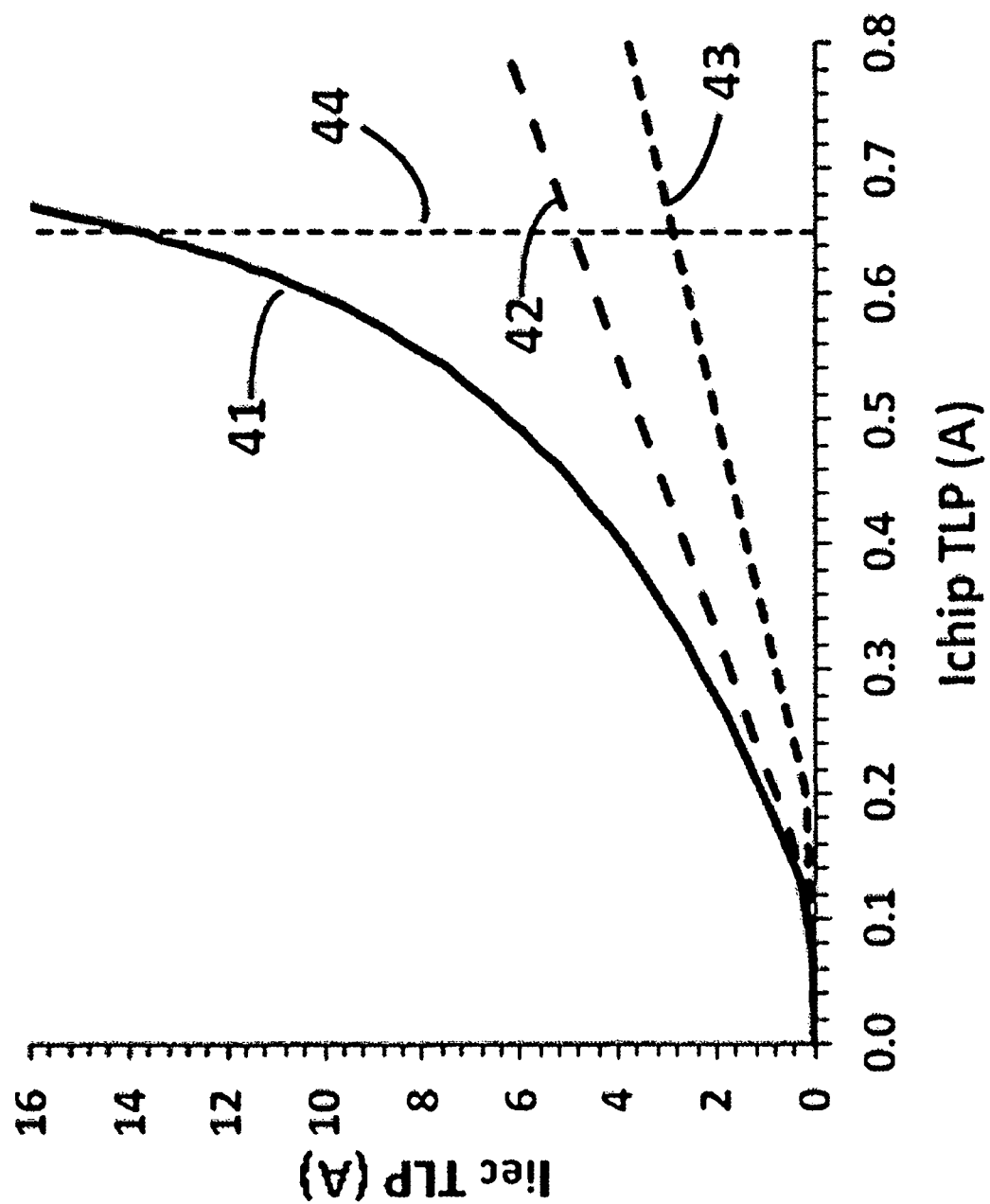
FIG. 4 shows an example of the TLP transfer function between system input current and chip input current for different protection configurations according to certain aspects of the present disclosure.

FIG. 4 shows the TLP transfer function between the system input current 21 and the chip input current 17. Three plots are shown in FIG. 4 for the three cases discussed above. The cure 43 corresponds to the first case of zero ohms resistor. The curve 42 corresponds to the second case of a linear resistor with a fixed resistance of 1.25Ω. The curve 41 corresponds to the non-linear resistor 12, which has a resistance of 1.25Ω under normal operating conditions. As discussed above the resistance of the non-linear resistor 12 greater increases as the non-linear resistor 12 enters the velocity saturation region. The value 1.25Ω is low enough, in most cases, to have a negligible effect on the transmission and reception of signals from the chip I/O circuit 15. The curve 43 with zero ohms resistor shows that at the chip input 17 failure current of 0.667 A (indicated by the vertical failure marking line 44 of FIG. 4), the input IEC TLP current 15 is only 2.93 A, well below the desired 12 A. For a fixed 1.25Ω linear resistor, line 42 crosses the 0.667 A chip input current 17 at an IEC TLP input current of 5.0 A, which is still well below the target 12 A. For the velocity saturation curve 41 of the non-linear resistor 12, the 0.667 A intercept corresponds to an IEC TLP input current of 15.6 A, well above 12 A. Thus, for the first and second cases, the I/O circuit 15 will become damaged at 12 A TLP while the third case with the non-linear resistor 12 meets the 12 A TLP input current and protects the I/O circuit 15 from damage with margin. The voltage at the node 18 for a chip input current 17 of 0.667 A is 2.90V for the first case of zero ohm resistor, 3.72V for the second case of a 1.25Ω linear resistor, and 7.98V for the third case of the non-linear resistor 12. Thus, the voltage across SCR 11 can be much higher before the protected chip fails allowing a much higher current to be shunted.

In the above analysis, the non-linear resistor 12 is implemented with a velocity saturation resistor. The velocity saturation resistor may be implemented with an implanted N-well resistor based on a set of equations which account for doping concentration, implant depth, mobility, and temperature.

Figure 5A:
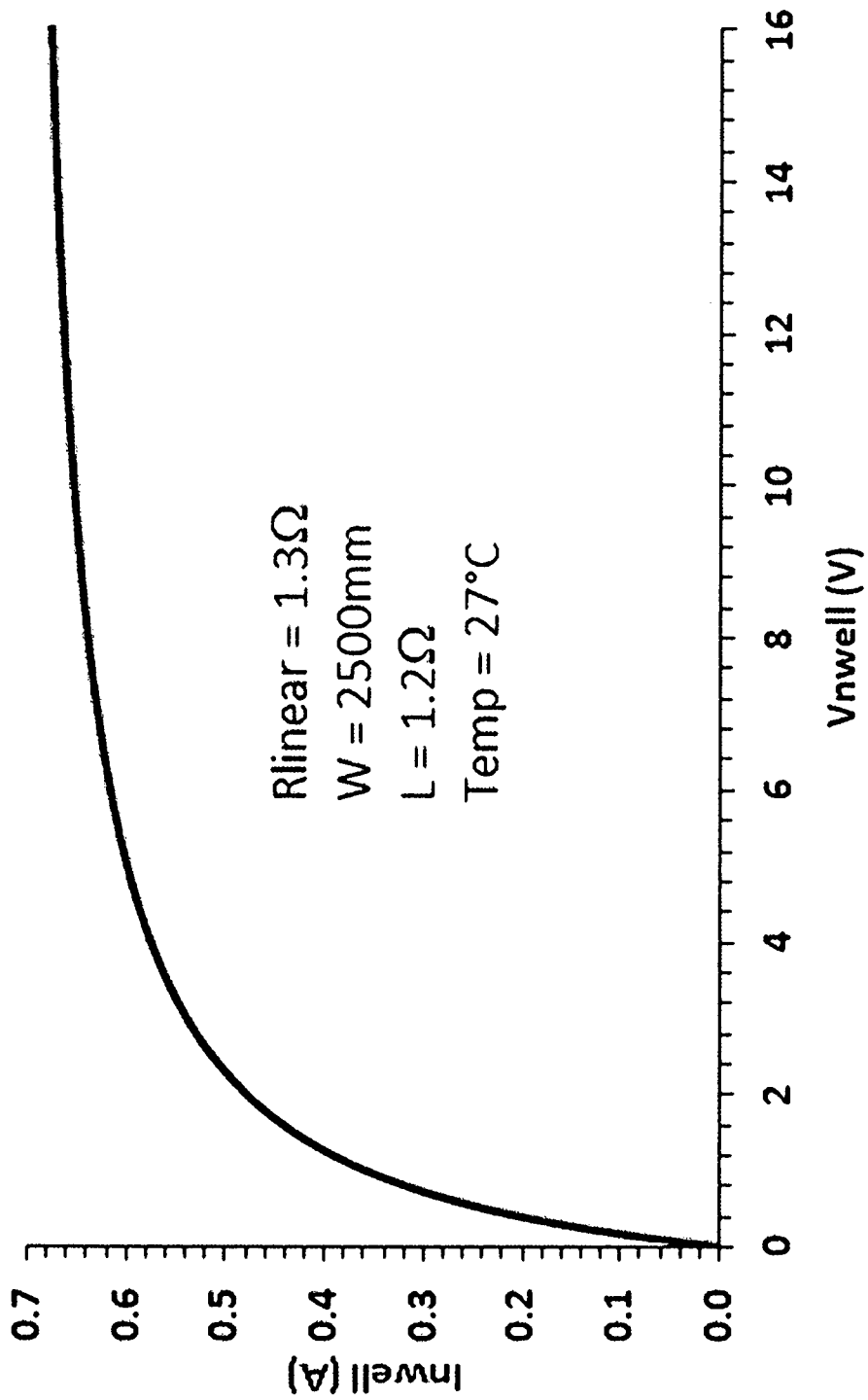
FIG. 5A shows an example of a plot of current versus voltage for an N-well resistor according to certain aspects of the present disclosure.

FIG. 5A shows an I-V curve for the specific parameters shown on the plot which can be implemented in a semiconductor process. Using these parameters, the curve 41 in FIG. 4 was generated. The basic equation for velocity saturation is $$I = \frac{q\mu V N_D W t}{L + \frac{\mu V}{v_{sat}}} \quad (1)$$

where
q is electronic charge (1.6e-19 coulomb),
$\mu$ is the conduction mobility (cm$^2$/V-sec),
$N_D$ is the well impurity doping of the resistor (1/cm$^3$),
W is the well width (cm),
L is the well length (cm),
V is the applied voltage (V),
t is the depth of the well (cm), and
$v_{sat}$ is the carrier velocity saturation (cm/sec).

For mobility, $\mu$, an equation is used relating mobility to doping concentration and temperature. For the velocity saturation, an equation is used relating velocity saturation to temperature. As can be seen in the plot, for low level currents such as signal currents on the order of tens of mA the velocity saturation resistor is approximately linear. Thus, for signal currents under normal operating conditions, the velocity saturation resistor will appear linear while at high ESD currents the velocity saturation resistor exhibits a saturated current characteristic. The saturation current is given by:

$$I_{sat} = q N_D W t v_{sat} \quad (2)$$

Figure 5B:
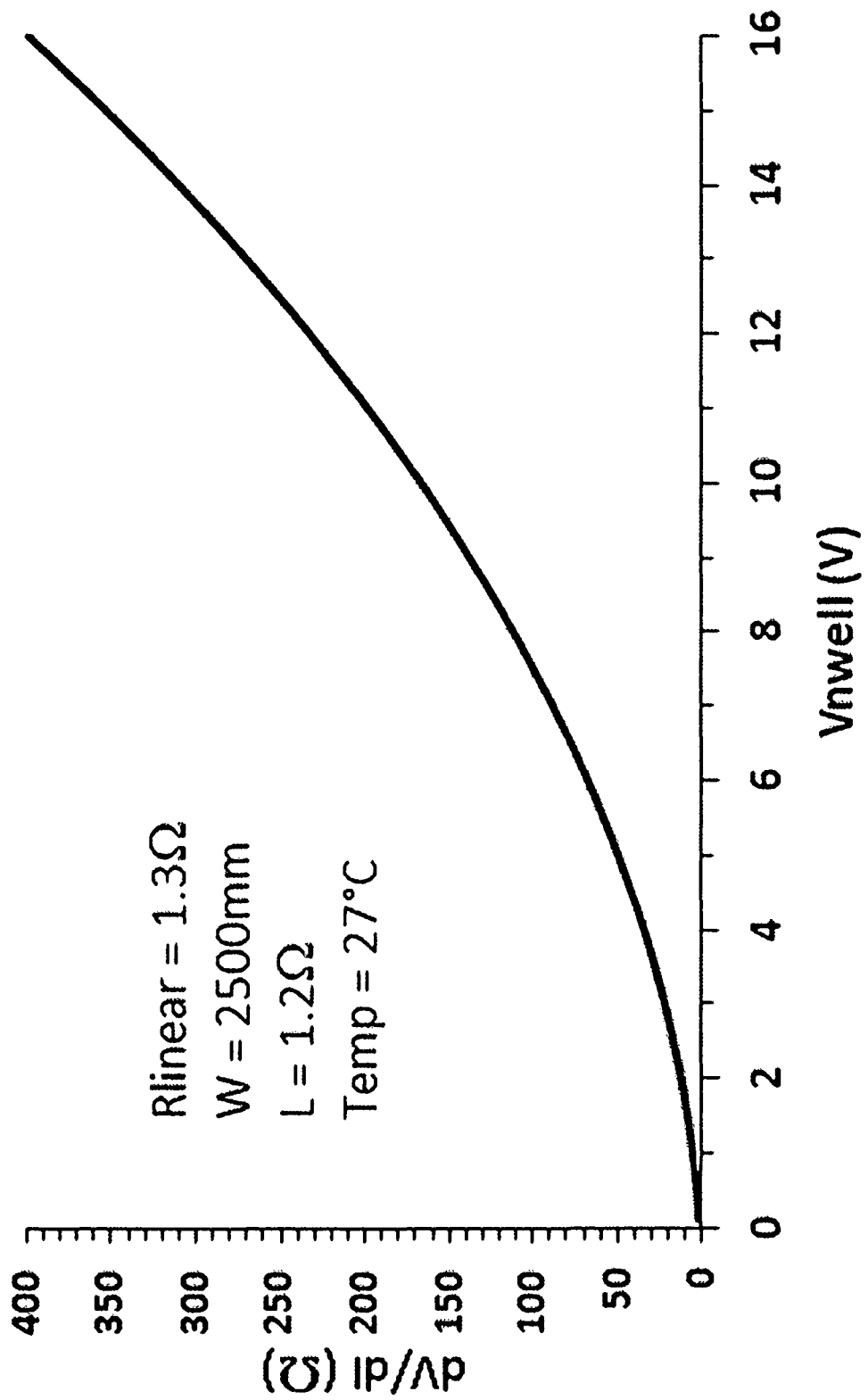
FIG. 5B shows a dynamic resistance plot for the I-V curve shown in FIG. 5A according to certain aspects of the present disclosure.

FIG. 5B shows a dynamic resistance plot corresponding to the I-V plot of FIG. 5A. The dynamic resistance is given by dV/dI (i.e., derivative of voltage with respective to current). Dynamic resistance is not to be confused with static resistance which is given by V/I. As seen in FIG. 5B, the dynamic resistance increases dramatically as the voltage increases. For low I/O signal level currents under normal operating conditions, the dynamic resistance is low. For higher ESD level voltages, the dynamic resistance is much higher thereby limiting the current with voltage. Ideally, for a voltage that is larger than that produced by the maximum I/O current, the dynamic resistance goes to infinity. However, physical non-linear resistance devices approximate current limiting. In this regard, the dynamic resistance of the non-linear resistor 12 may be made large enough beyond the voltage corresponding to the maximum operating I/O current such that the current does not increase to levels that would damage the I/O circuit 15 for voltages expected across the TVS clamp during an ESD discharge.

In certain aspects, the non-linear resistor 12 has a low dynamic resistance (e.g., equal to less than two ohms) at, e.g., a voltage of 100 millivolts across the resistor 12, which represent a normal operating condition. In one example, the non-linear resistor 12 may have a dynamic resistance at a voltage of three volts across the resistor that is at least five times greater or at least ten times greater than the dynamic resistance at the voltage of 100 millivolts across the resistor 12. In another example, the non-linear resistor 12 may have a dynamic resistance at a voltage of five volts across the resistor that is at least ten times greater or at least 20 times greater than the dynamic resistance at the voltage of 100 millivolts across the resistor 12. In yet another example, the non-linear resistor 12 may have a dynamic resistance at a voltage of ten volts across the resistor that is at least 30 times greater or at least 50 times greater than the dynamic resistance at the voltage of 100 millivolts across the resistor 12. In yet another example, the non-linear resistor 12 may have a dynamic resistance at a voltage of 15 volts across the resistor that is at least 100 times greater or at least 50 times greater than the dynamic resistance at the voltage of 100 millivolts across the resistor 12.

Figure 5C:
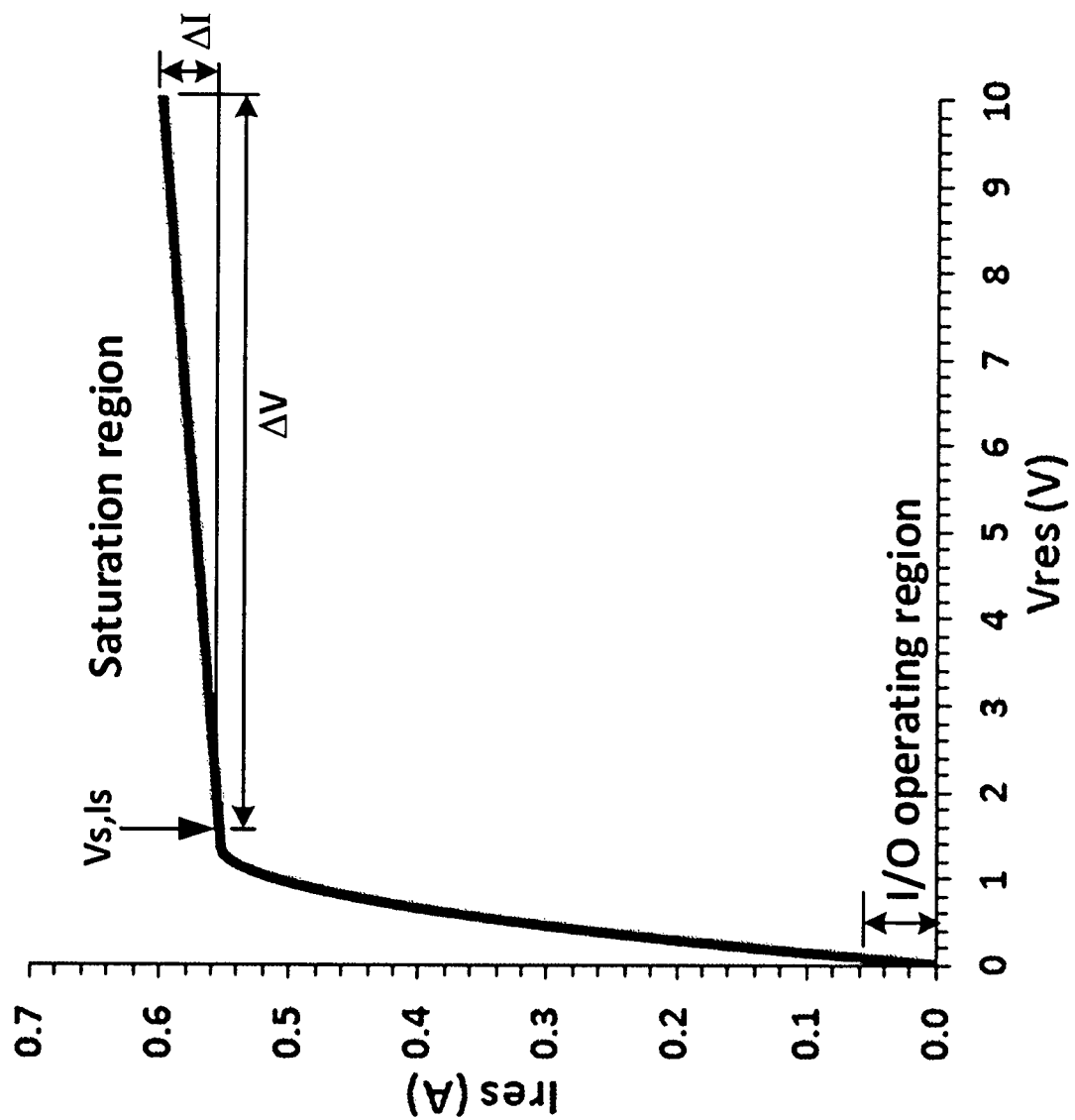
FIG. 5C shows a plot of a non-linear resistor illustrating a metric for specifying a saturation region according to certain aspects of the present disclosure.

FIG. 5C shows a method for defining a velocity saturation region that can be realistically found in physical devices. In this example, a voltage and current point on the I-V plot, Vs and Is, is specified beyond the low resistance, low voltage operating region of the I/O circuit 15. For a voltage increase beyond this point given by $\Delta V$, there is only a small percentage increase in the current given by $\Delta I$. This property limits the current flowing to the I/O circuit 15 during an ESD event. In one example, the current through the resistor 12 may change by less than 20 percent or less than 15 percent from a voltage of two volts across the resistor to a voltage of twelve volts across the resistor. In another example, the current through the resistor 12 may change by less than 30 percent from a voltage of two volts across the resistor to a voltage of twenty volts across the resistor. In yet another example, the current through the resistor 12 may change by less than 20 percent or less than ten percent from a voltage of two volts across the resistor to a voltage of six volts across the resistor. In the above examples, the current at the voltage of two volts may be between 300 milliamperes and 1.3 amperes.

The non-linear resistor 12 may also be realized using heating effects instead of velocity saturation. As the heat builds up in a metal or poly resistor of an integrated circuit, the resistance increases causing the TLP I-V curve to bend down and even flatten out or saturate just before catastrophic rupture causing the resistor to open up from melting. This effect can be used to absorb voltage just before the resistor reaches rupture.

Active semiconductor devices that have a characteristic I-V curve similar to that shown in FIG. 5A may also be used to provide non-linear resistance between the shunt clamp and the I/O circuit 15 such as a depletion mode Metal Oxide Semiconductor Field Effect Transistor (MOSFET) or a Junction Field Effect Transistor (JFET). A two terminal device with a linear region low current I-V curve and a current saturation curve may be implemented created by tying the gate of the MOSFET or JFET to its respective source. Depletion MOSFETs have threshold voltages that are negative for N type devices and positive for P type devices meaning that they are normally "on" when the gate is tied to the source.

Figure 6:
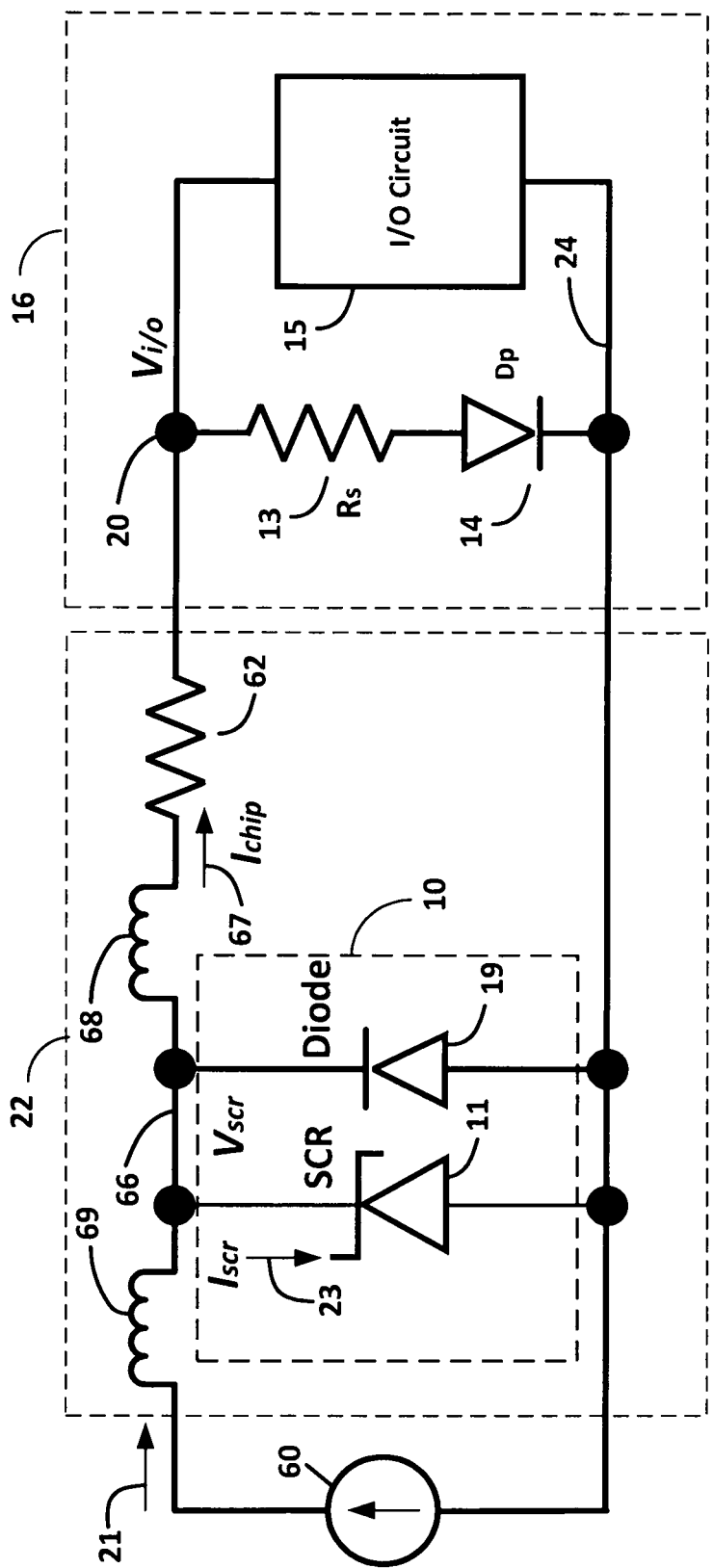
FIG. 6 shows an example of a protection circuit including a T coil according to certain aspects of the present disclosure.

An issue in using external clamps to meet an IEC 64000-4-2 specification is to minimize capacitance loading for high speed data I/O such as SERDES. The shunt clamp's main loading effect for high speed signals is capacitance which degrades high speed signals and lowers bandwidth. To improve the bandwidth in the presence of unwanted capacitance, T coils may be used. The bandwidth improvement for a T coil is about a factor of 2.8. The T coil may be made up of 2 mutually connected inductors or coils 68 and 69, an example of which is illustrated in FIG. 6. The mutual inductance between the coils make the structure a transformer. T coils can be placed on a chip typically using 2 levels of metal.

Also shown in FIG. 6 is a velocity saturation resistor 62. In the example in FIG. 6, the resistor 62 is placed to the right of coil 62. However, it is to be appreciated that the resistor 62 may be placed between node 66 and the left terminal of coil 68. To optimize ESD performance, resistor 62 may be a designed with velocity saturation at IEC specified ESD current levels. Since transmission lines typical have a characteristic impedance of 50Ω to 100Ω the low value resistance of 62 can be easily accounted for in the design.

Figure 7:
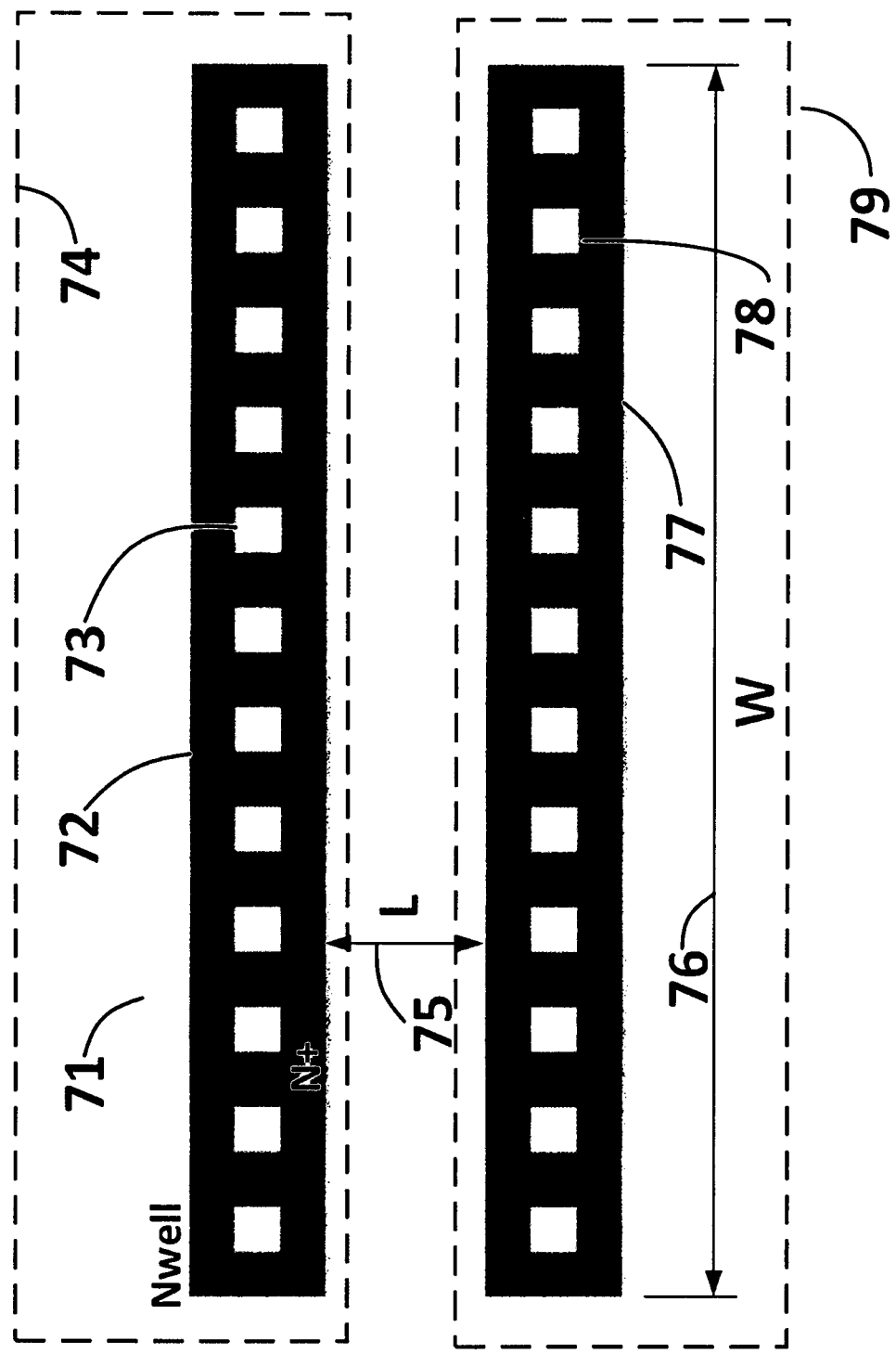
FIG. 7 shows a top view of an exemplary N-well resistor according to certain aspects of the present disclosure.

FIG. 7 shows a top view of an exemplary layout of an N-well resistor that may be used to implement the resistor 12. The N-well resistor includes an N-well 71 which forms the resistor, a first N+ region 72 and a second N+ region 77. The N-well 71 and the N+ regions 72 and 77 may be implanted. At least a portion of the N-well 71 is between the first and second N+ regions 72 and 77, as shown in FIG. 7. The first N+ region is used to connect the N-well 71 to the contacts 73. The contacts 73 are coupled to a first metal terminal of the resistor. The second N+ region 77 is used to connect the N-well 71 to the contacts 78. The contacts 78 are coupled to a second metal terminal of the resistor. In the alternative, the resistor may be P type with a P-well implant, and P+ regions. Also, the resistor can be made from a polysilicon layer instead of bulk or substrate silicon.

The length 75 (labeled "L" in FIG. 7) between the first and second N+ regions may be constrained by the carrier velocity saturation term in Eq. 1. In this case, the length 75 may be a few microns. In one example, the length 75 is equal to or less than two microns. If the length is too small punch through or avalanche breakdown will occur at voltages too low (several volts or less) to make the resistor suitable.

A design parameter that influences the length 75 is the well doping concentration, $N_D$. The problem with heavily doped wells is that the mobility decreases with increasing doping concentration requiring a smaller length 75. At about a doping concentration of $8 \times 10^{16}/cm^3$ the required length 75 becomes submicron. The issue then becomes avalanche breakdown at the specified voltage of 10V. Furthermore, the area of the resistor becomes too small as can be seen in the equation below $$A_{rea} = \frac{LI_{sat}}{qtN_D v_{sat}} \quad (3)$$

Here, $I_{sat}$ is the saturation current as defined by Eq. 2. As seen above the area of the resistor (L×W) decreases with increasing doping density, $N_D$. Also, the length L decreases with increasing doping density as well. $I_{sat}$ is constrained to a low value needed to protect the circuit. The area of the resistor should be large enough to absorb heat without failing. As can be seen in Eq. 3, the area decreases with increasing doping density which makes the resistor increasing vulnerable to thermal failure under IEC test conditions. Thus, to make a suitable velocity saturation resistor for integrated circuits against an IEC pulse both the length of the resistor and the doping concentration may be limited. In this regard, the length may have a range from about 0.7 µm to 2.5 µm and the doping density in the N-well may be equal to or less to $1 \times 10^{17}/cm^3$.

Another issue in implementing an N-well resistor may be minimizing any two-dimensional current flow. In a normal P substrate CMOS process the N-well is much deeper than the N+ regions and completely covers the N+ region. This may produce a negative effect in which conduction not only takes place between the facing walls of the N+ regions but also the bottom of the N+ regions. The bottom conduction component is two dimensional and will have a varying electric field that is lower than the N+ to N+ facing wall component. This reduces the velocity saturation relative to the direct facing N+ wall to N+ wall component and, correspondingly, increases the saturation voltage and current.

Figure 8:
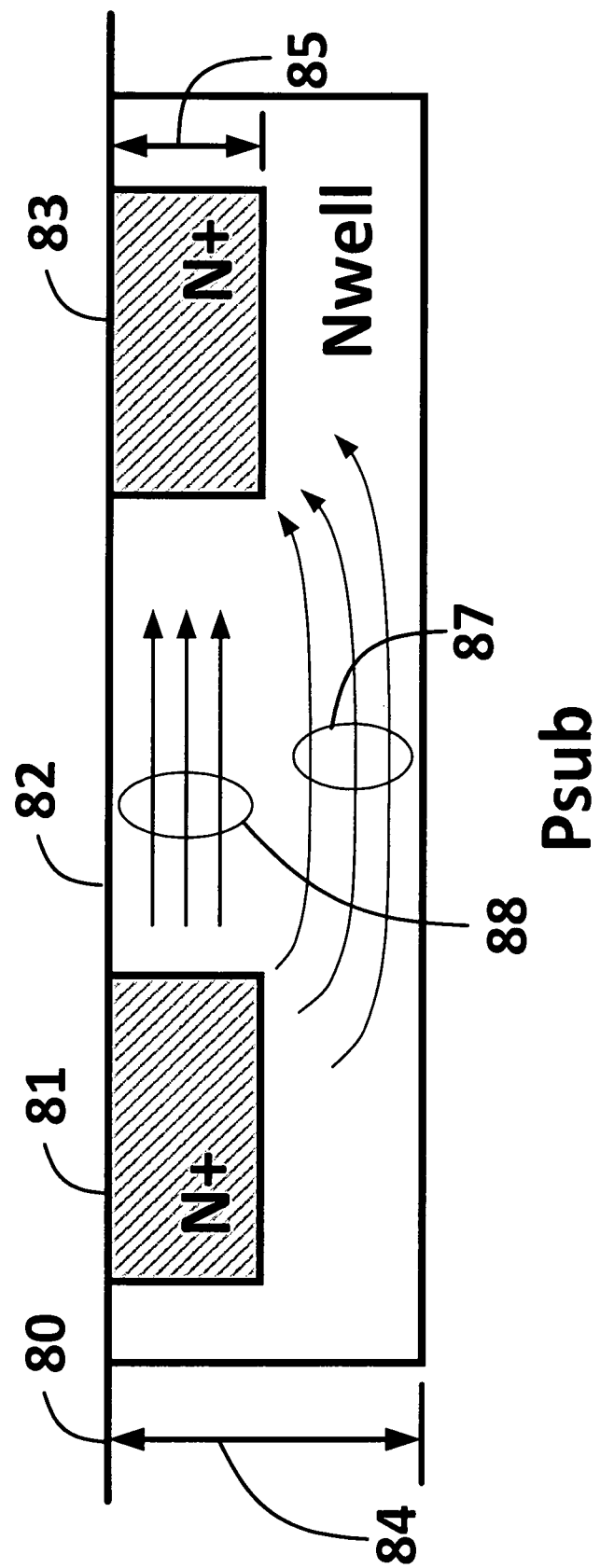
FIG. 8 shows a cross-sectional view of an exemplary N-well resistor including an N-well and N+ regions, in which the N-well has a greater depth than the N+ regions and completely surrounds the N+ regions according to certain aspects of the present disclosure.

FIG. 8 shows the cross section of the N-well resistor using standard CMOS layout rules. Shown are the silicon substrate 80 which is P type, the N+ regions 81 and 83 and the N-well 82. Note that the N-well depth 84 is greater than the depth 85 of the N+ regions. The facing walls of the two N+ regions 81 and 83 have current conduction trajectories 88 that have a straight path and a uniform electric field. Secondary current conduction trajectories 87 have longer paths and lower, non-uniform electric fields. For these longer paths, velocity saturation occurs at higher voltages than the direct path thereby reducing the current saturation characteristic with voltage.

Figure 9:
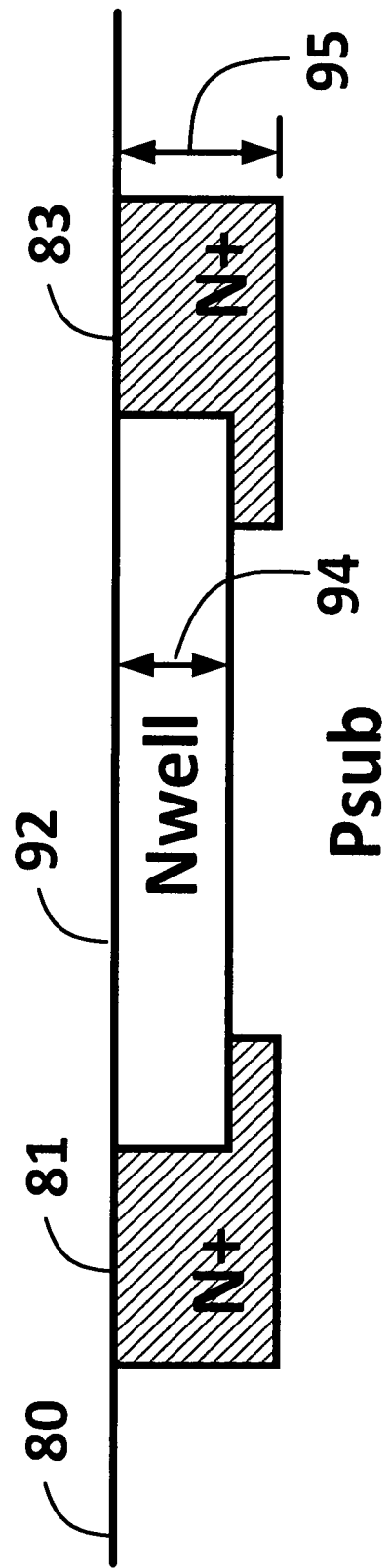
FIG. 9 shows a cross-sectional view of an exemplary N-well resistor including an N-well and N+ regions, in which the N-well has a smaller depth than the N+ regions according to certain aspects of the present disclosure.

To keep the current flow more one dimensional and to keep the electric field uniform in the N-well, the N-well implant depth may be less than the N+ implant depth, an example of which is shown in FIG. 9. Shown in FIG. 9 are the silicon substrate 80 which is P type, the N+ regions 81 and 83 and the N-well 92. Note that the N-well depth 94 is less than or equal to the depth 95 of the N+ regions 81 and 83 in this example. Thus, in this example, current flow is more uniform and more one dimensional with a more uniform electric field, which enhances the conduction velocity saturation characteristic.

Figure 10:
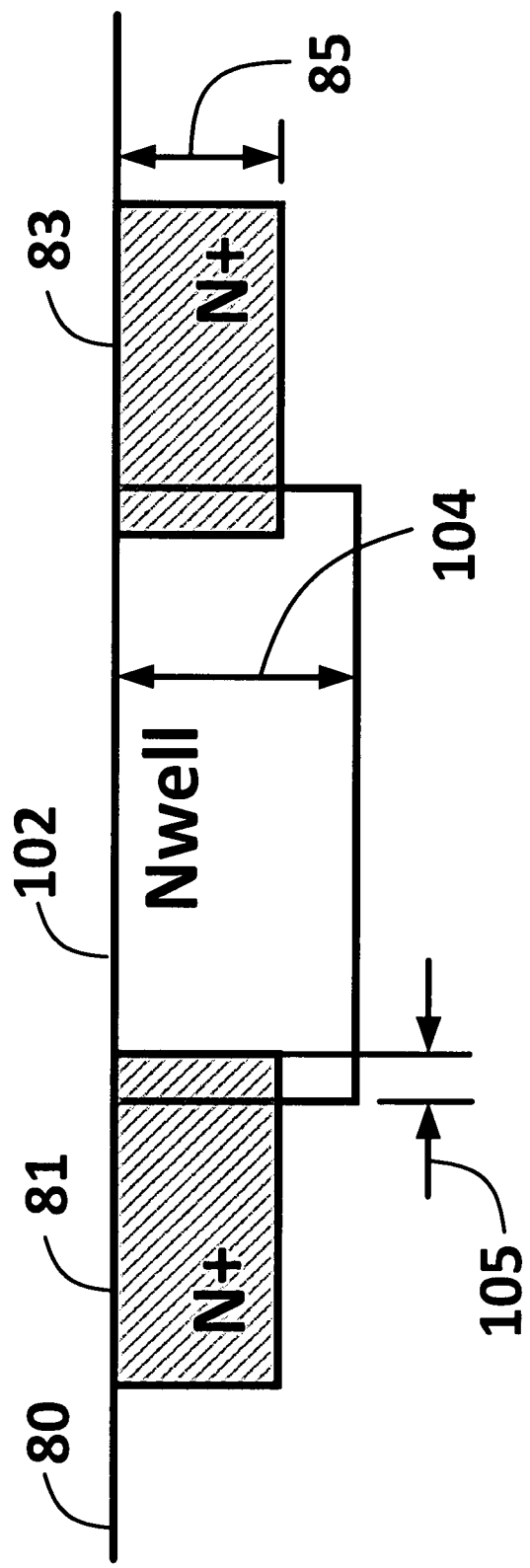
FIG. 10 shows a cross-sectional view of an exemplary N-well resistor including an N-well and N+ regions, in which the N-well has a greater depth than the N+ regions and overlap between the N-well and the N+ regions is minimized according to certain aspects of the present disclosure.

FIG. 10 shows a cross section of an example in which N-well 102 has a greater depth 104 than the N+ depth 85. In this example, two-dimensional non-uniform current flow is reduced by minimizing the overlap 105 between the N-well 102 the N+ regions 81 and 83. In this example, the overlap 105 may be just enough to establish a good connection between the N-well 102 and the N+ regions 81 and 83. For example, the overlap between the N-well 102 and the area of the bottom (i.e., bottom area) of each of the N+ regions 81 and 83 may be less than 20 percent or less than 10 percent to substantially reduce the secondary bottom current conduction shown in FIG. 8. In the example in FIG. 8, the overlap between the N-well 102 and the bottom area of each of the N+ regions 81 and 83 is 100 percent.

Figure 11:
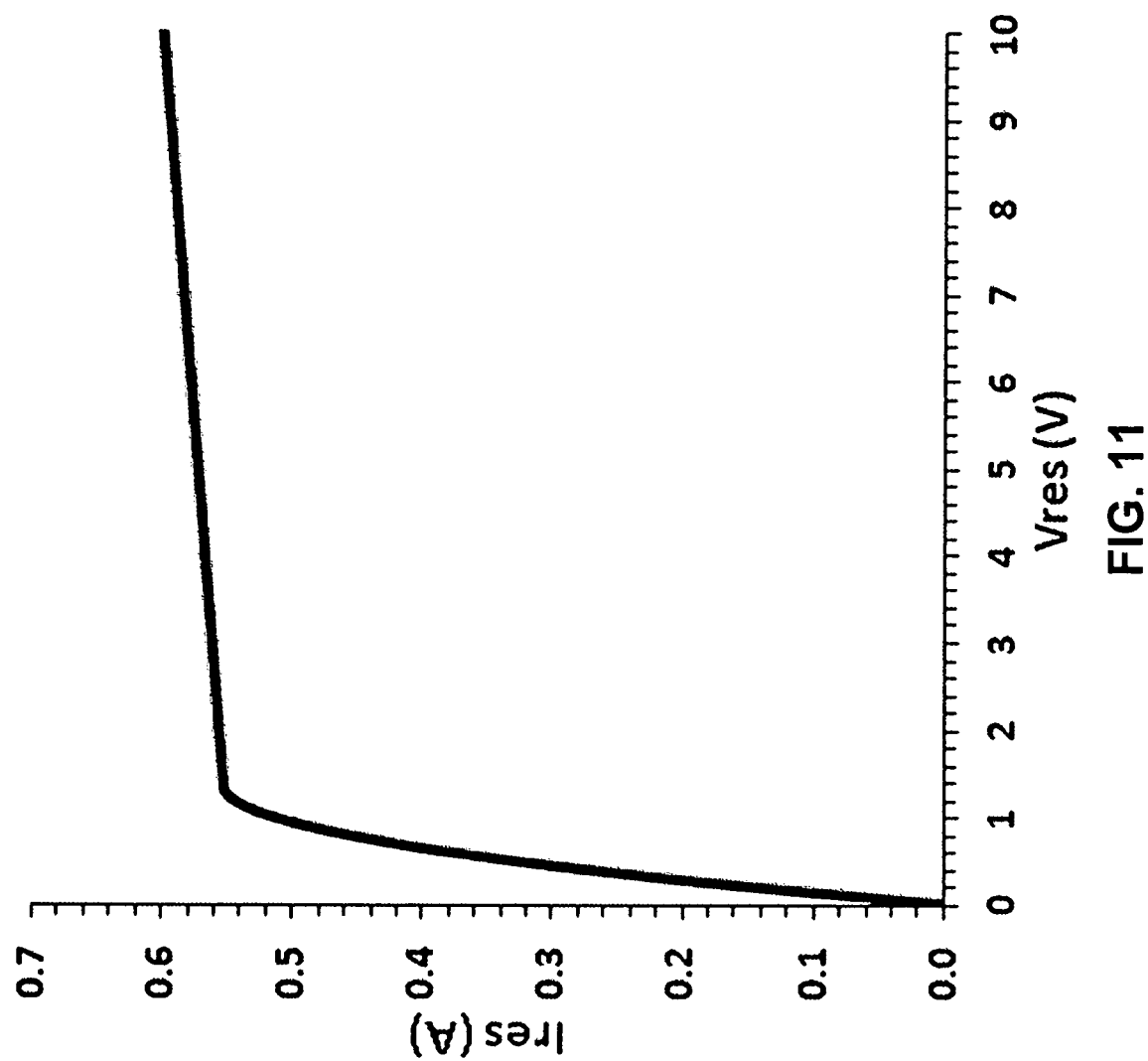
FIG. 11 shows a plot of exemplary I-V characteristics for a junction field effect transistor (JEFT) according to certain aspects of the present disclosure.

As discussed above, non-linear resistance between the shunt clamp 10 and the I/O circuit 15 may also be realized using JFETs and MOSFETs since they have a linear region at low voltages and currents and a current saturation characteristic at higher voltages and currents. FIG. 11 shows an example of a JFET characteristic simulated using Spice. For the parameters shown in FIG. 11 the resistance is 1.25Ω for I<100 mA and for I=0.667 A the voltage is 10V. A MOSFET can have very similar characteristics.

Figure 12:
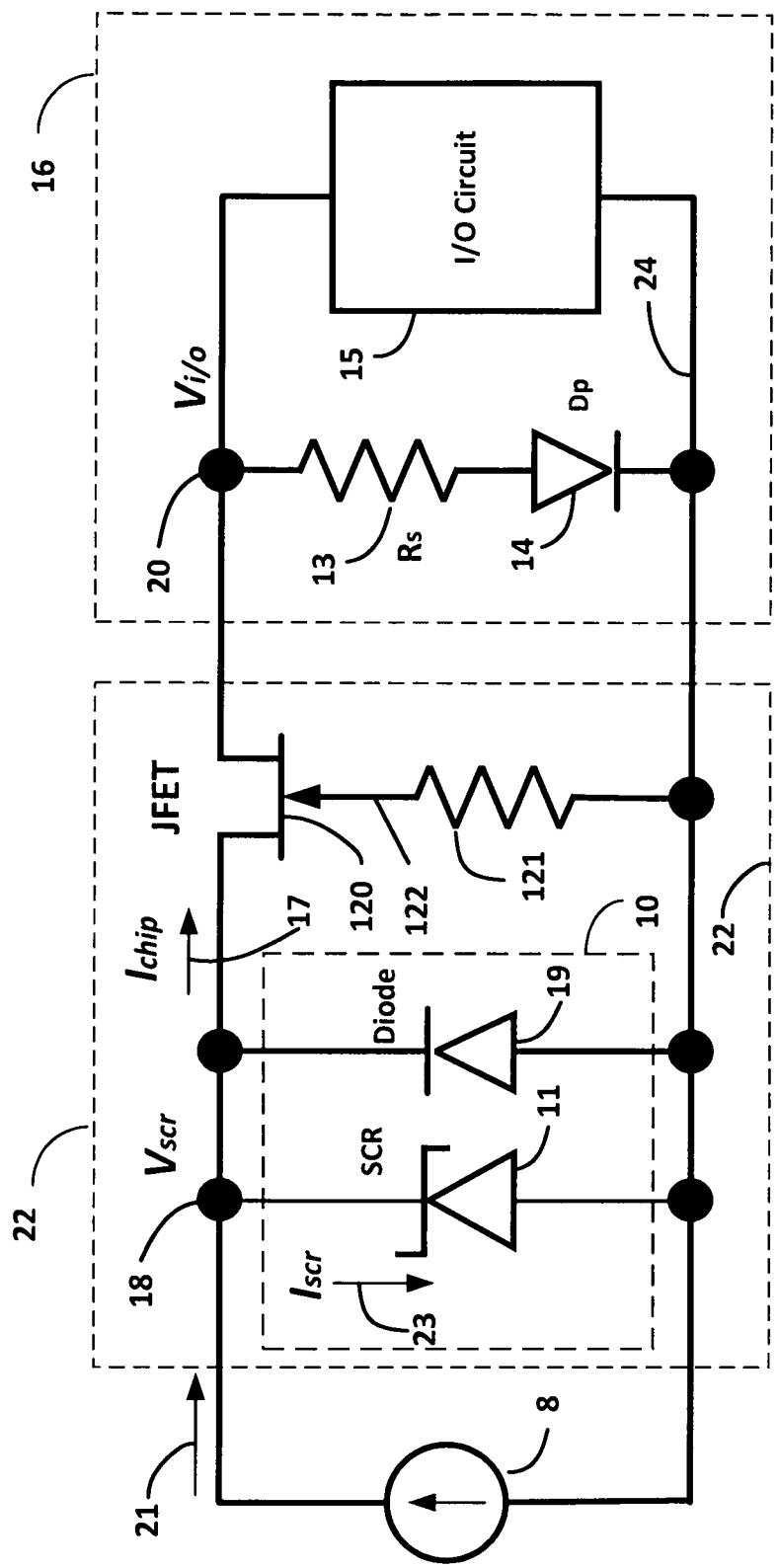
FIG. 12 shows an example of a protection circuit including a shunt clamp and a JFET according to certain aspects of the present disclosure.

In this regard, FIG. 12 shows an example in which the non-linear resistor 12 in FIG. 2B is replaced with a N type JFET 120. The gate of the JFET 122 is coupled to Vss 24 or ground through a resistor 121. In one case the resistor can be a connection to Vss using metal so that the value of resistor 121 is approximately zero ohms. If the capacitance of the gate's 122 P+ implant is an issue, the resistor 121 can be used with a high value or the resistor can be omitted thereby floating the gate's 122 P+ implant.

In certain aspects, there are two criteria for a voltage absorbing element. The first criteria is that, for low current operation (i.e., normal I/O function), the element has a low resistance (e.g., less than 5Ω) to ensure the element has little to no impact on the performance of the I/O circuit 15. The smaller the resistance the better within the limits imposed by the second criteria and the I-V characteristic of the second criteria.

Figure 13:
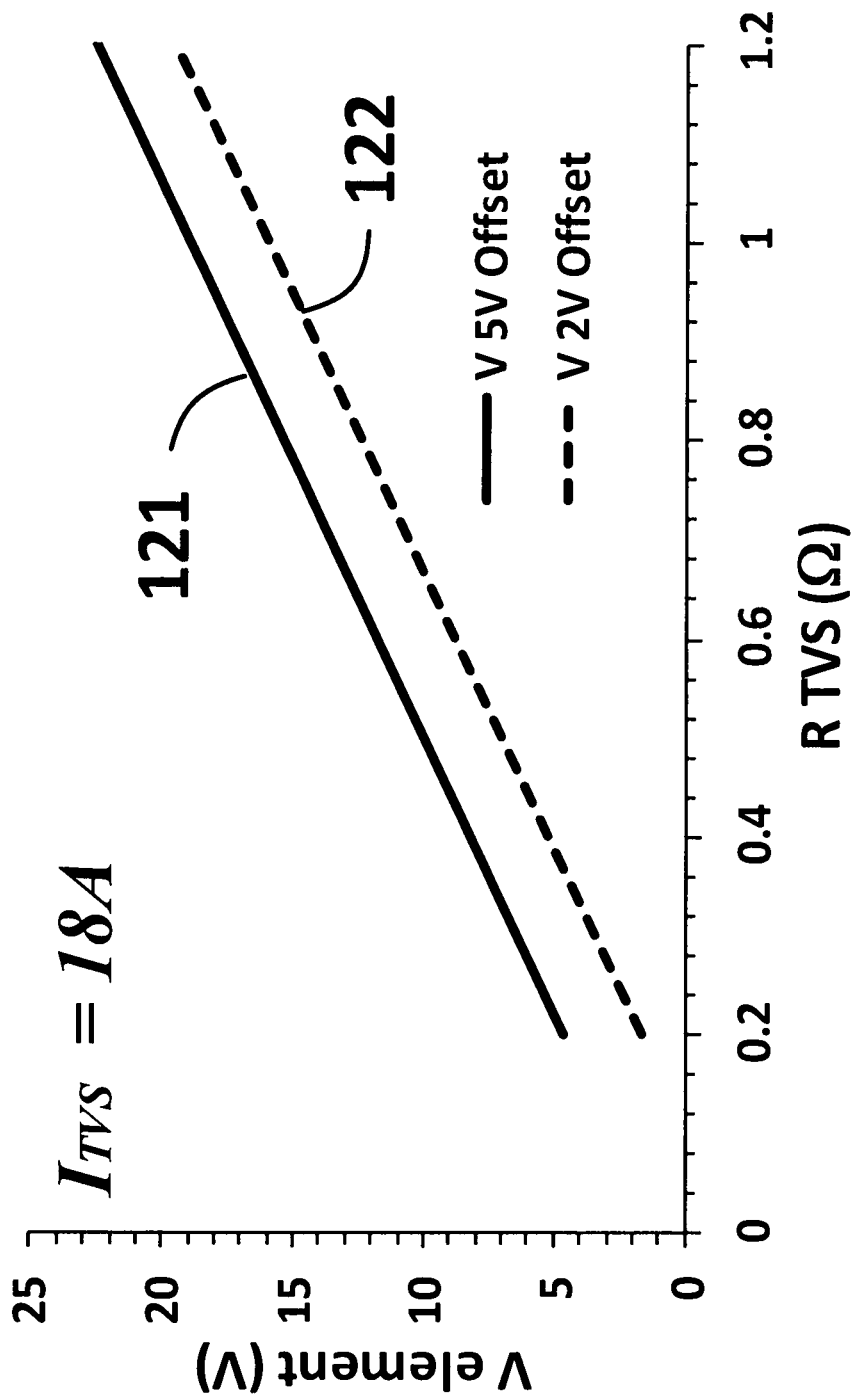
FIG. 13 shows an exemplary plot of voltage drop required across a voltage absorbing element as a function of transient voltage suppressor (TVS) resistance.

For establishing the second criteria the JEDEC 1000V HBM recommendation may be used since it is the most common value specified for ESD HBM tolerance by chip manufacturers. The corresponding peak discharge current, which is nominally 0.667 A, will be used for this analysis. An IEC Level 4 contact discharge will also be used which has a $2^{nd}$ peak current of 18 A. The first peak current will not be used since it occurs over a very short period of time. FIG. 13 shows a plot of the required voltage drop of the absorbing element versus "on" resistance of the TVS clamp for both a 2V offset 121 (SCR) and a 5V offset 122 (snap-back bipolar transistor or Zener diode). The minimum voltage that can cause an I/O failure is assumed to be 4V which is a good estimate for the common 1.8V I/O. Assuming that the minimum resistance possible is 0.25Ω for a TVS clamp the voltage drop across the clamp is 6.5V for the 2V offset and 9.5V for the 5V offset. The minimum voltage drop for the voltage absorbing element is therefore 2.5V for the 2V TVS offset and 5.5V for the 5V TVS offset after subtracting the 4V maximum allowed drop across the I/O. At the other extreme, for a TVS with an "on" resistance of 1.2Ω and an offset of 5V the maximum voltage required for the voltage absorbing element is 22.6V. Thus, for a TVS clamp with a 5V offset and an "on" resistance of 1.2Ω the voltage absorbing element will have to tolerate a voltage drop as high as 22.6V for I=0.667 A and have a low current (<100 mA) resistance of <5Ω for the other extreme a voltage drop as low as 2.5V for I=0.667 A. Of course, the voltage absorbing element can be designed with reduced voltage tolerance range limits for a smaller number of TVS clamp types.

Thus, for an I/O rated at 1 kV HBM with a failure voltage of at least 4V, it is desirable for a voltage absorbing element to have the following properties:
1. A low current (≤100 mA) resistance that is less than 5Ω; and
2. A voltage drop range of 2.5 to 23V depending on TVS clamp characteristics for a current of 0.667 A Based on the exemplary above analysis, it is desirable for a voltage absorbing element to have a current saturation like characteristic at the peak HBM rated current as well as a linear resistance characteristic for an I/O operational current of 100 mA or less. The ratio of linear resistance to saturation resistance may be at least 1:8. It is to be appreciated that the present disclosure is not limited to the above examples.

Figure 14:
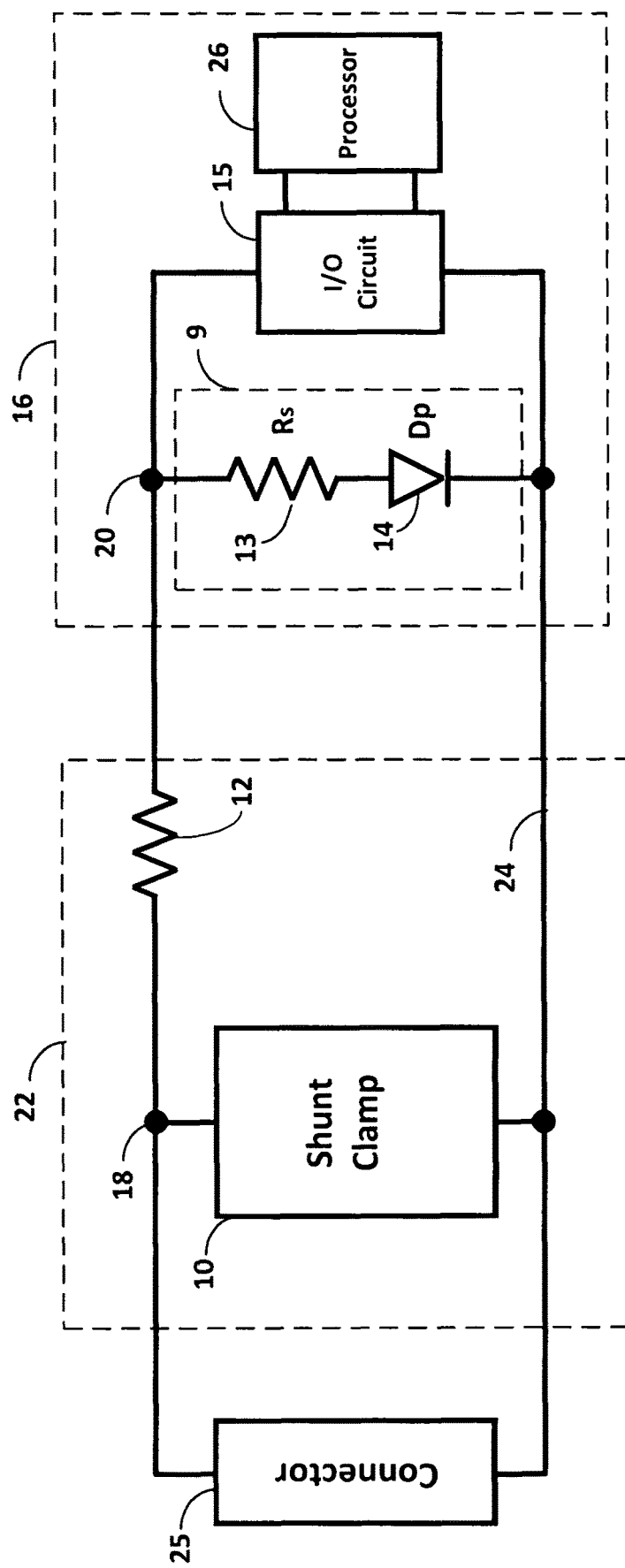
FIG. 14 shows an example in which a protection circuit is coupled between a connector and an integrated circuit according to certain aspects of the present disclosure.

FIG. 14 shows an example in which the resistor 12 is coupled between a connector 25 and the chip 16. The connector 25 may be configured to detachably couple to a cable, a memory card, or a subscriber identification module (SIM) card. The cable may be an audio cable, a universal serial bus (USB) cable, a high definitional multimedia interface (HDMI) cable, etc. In this disclosure, the term "detachably couple" means that a user can easily couple and decouple a cable, card or other structure to the connector 25 (e.g., by plugging an end of the cable into the connector 25 and pulling the end of the cable out of the connector 25). The connector 25 may include a receptacle in which an end of the cable or a card can be inserted, and may include one or more electrical contacts configured to make electrical contact with one or more corresponding electrical contacts on the end of the cable or card. In this example, the connector 25 allows an external device to be coupled to the chip 16 via a cable and/or a card to be coupled to the chip 16. Alternatively, the connector 25 may be permanently coupled (e.g., soldered) to a cable or other structure.

In the example in FIG. 14, the chip 16 includes an integrated processor 26. The processor 26 may include at least one of a graphics processor, an audio processor, a video processor, a digital signal processor, and a central processing unit (CPU). In this example, the I/O circuit 15 interfaces the processor 26 to devices external to the chip 16, and may include one or more drivers, one or more receivers, one or more voltage-level shifters, etc. The processor 26 may transmits signals to an external device via the I/O circuit 15 and the connector 25, and receive signals from the external device via the I/O circuit 15 and the connector 25. The I/O circuit 15 and the processor 26 may each be considered an integrated circuit integrated on chip 16. The I/O circuit 15 and the processor 26 may also collectively be considered one integrated circuit since they are both integrated on the same chip 16 in this example.

Figure 15:
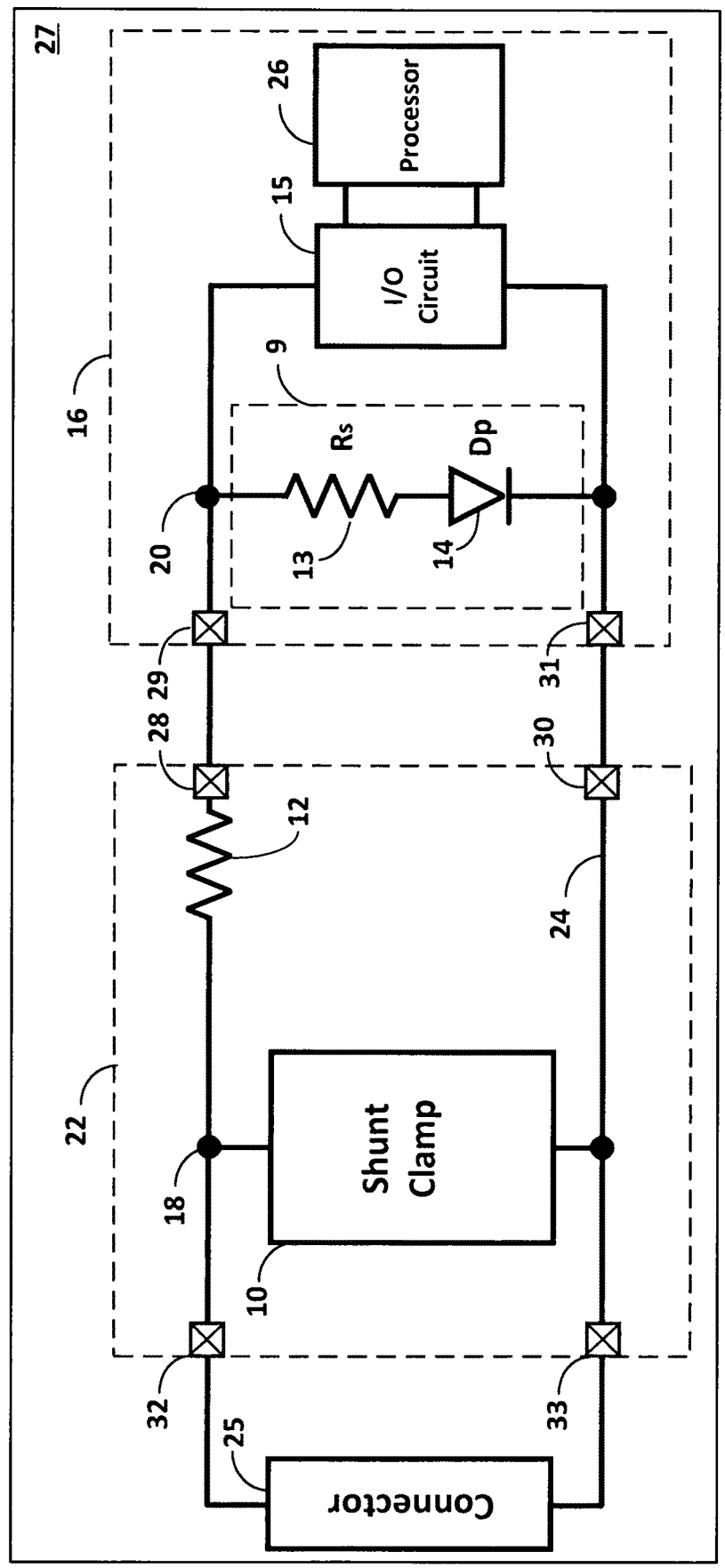
FIG. 15 shows an example in which the protection circuit is on an external chip with input/output (I/O) pads according to certain aspects of the present disclosure.

FIG. 15 shows an example in which the chip 22 includes I/O pads 28, 30, 32 and 33. Each I/O pad is a structure (e.g., upper layer metal structure) that couples an internal structure of the chip 22 (e.g., the resistor 12) to a structure off the chip 22 (e.g., via a wire, metal trace, solder bump and/or package pin). In the example in FIG. 15, the shunt clamp 10 is coupled to I/O pad 32 and the resistor 12 is coupled between the shunt clamp 10 and I/O pad 28. The chip 16 also includes I/O pads 29 and 31. In this example, the chips 22 and 16 may be mounted on a substrate 27 (e.g., a printed circuit board, ceramic substrate, etc.) in which the chips 16 and 22 are coupled via metal traces on the substrate. The metal traces may be coupled to the I/O pads 28, 29, 30 and 31 via wires, package pins, solder bumps, etc. The connector 25 may also be mounted on the substrate and coupled to the I/O pads 32 and 33 on the chip 16 via metal traces on the substrate 27.

Figure 16:
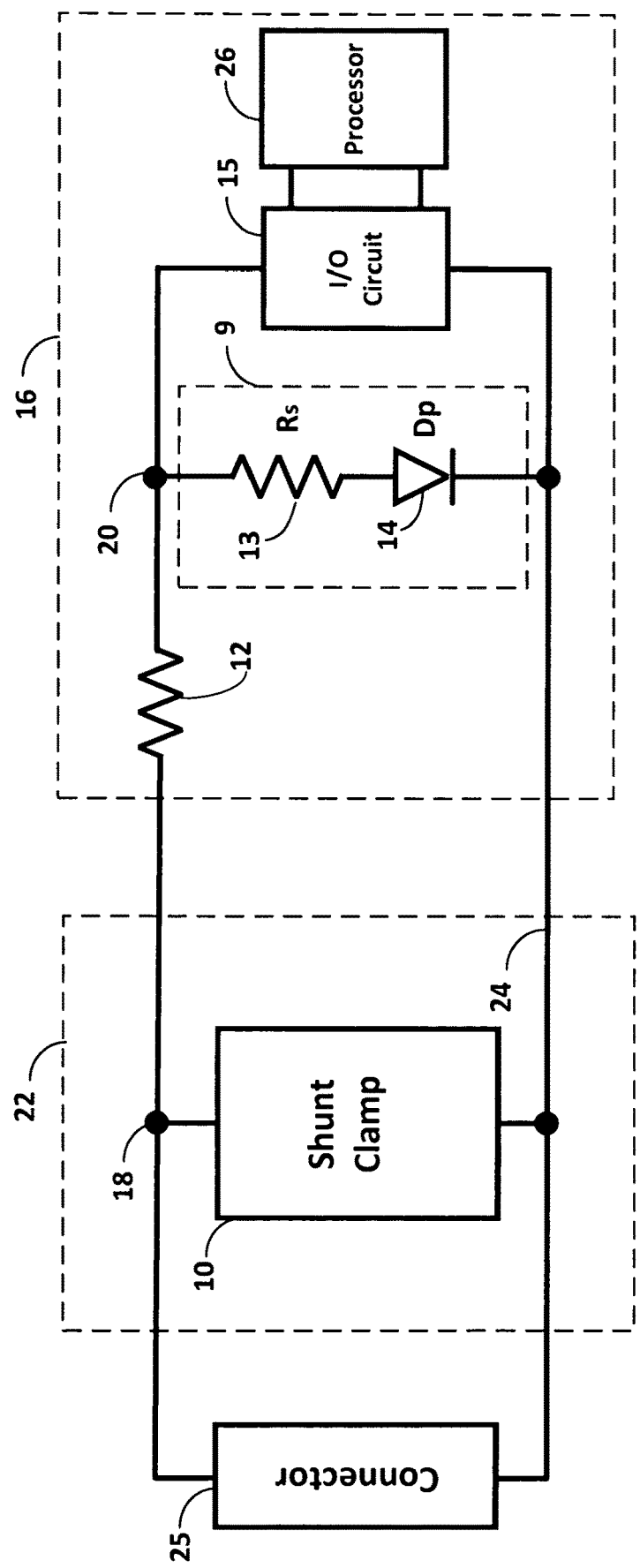
FIG. 16 shows an example in which the resistor is on the same chip as the integrated circuit according to certain aspects of the present disclosure.

FIG. 16 shows an example in which the resistor 12 is integrated on the same chip 16 as the I/O circuit 15 while the shunt clamp 10 is integrated on the external chip 22.

Figure 17:
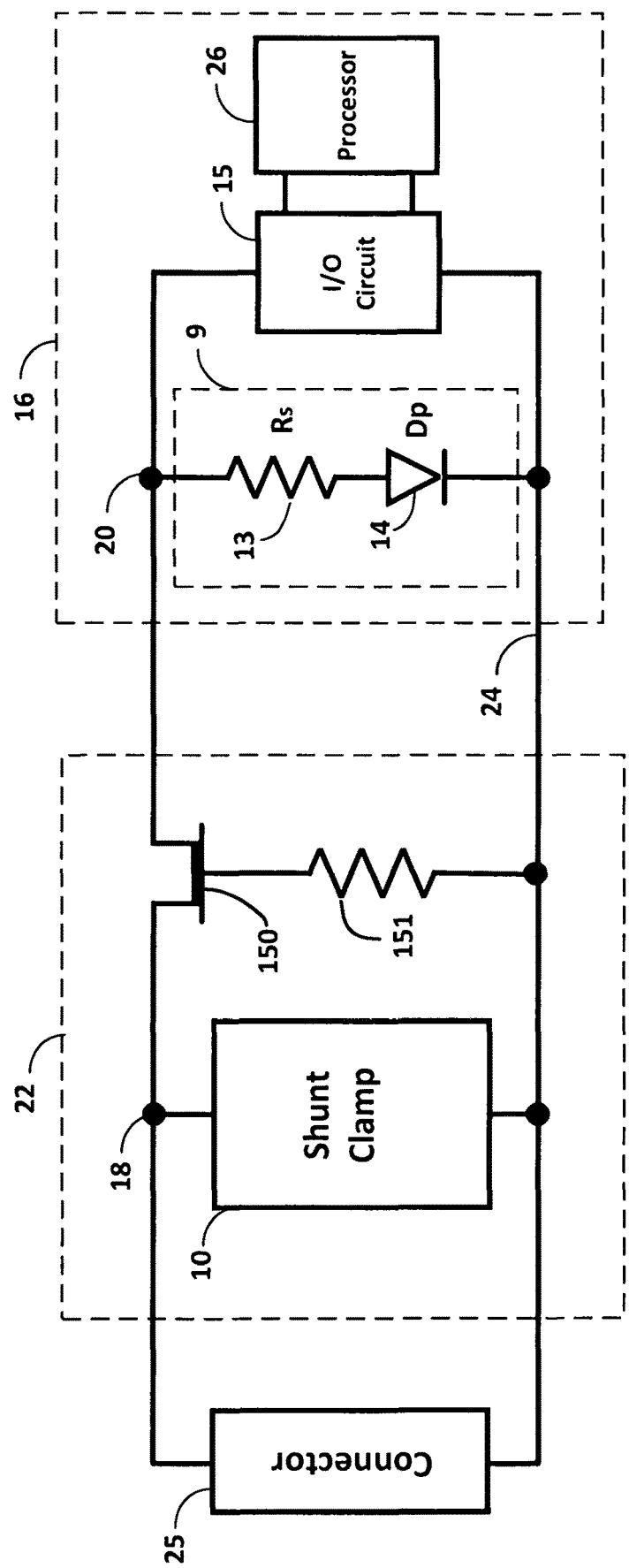
FIG. 17 shows an example of a protection circuit including a shunt clamp and a depletion mode field effect transistor according to certain aspects of the present disclosure.

As discussed, a depletion mode MOSFET may be used to provide non-linear resistance between the shunt clamp and the I/O circuit 15. In this regard, FIG. 17 shows an example of a depletion mode MOSFET 150 in which the channel of the depletion mode MOSFET 150 is coupled between the shunt clamp 10 and the I/O circuit 15, and the gate of the depletion mode MOSFET 150 is coupled to ground 24 via a resistor 151.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct electrical coupling between two structures or indirect electrical coupling between two structures. The phrase "at least one of A, B and C" means A, B or C or AB, BC or AC or ABC.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

The invention claimed is:

1. A system, comprising:
   a shunt clamp;
   an integrated circuit; and
   a resistor coupled between the shunt clamp and the integrated circuit, wherein the resistor has a first dynamic resistance at a voltage of 100 millivolts across the resistor, the resistor has a second dynamic resistance at a voltage of three volts across the resistor, the second dynamic resistance is at least five times greater than the first dynamic resistance, and the resistor comprises:
   a first N+ region on a substrate;
   a second N+ region on the substrate; and
   an N-well on the substrate, wherein at least a portion of the N-well is disposed between the first N+ region and the second N+ region, and a depth of the N-well is less than a depth of the first N+ region and less than a depth of the second N+ region.

2. The system of claim 1, wherein the second dynamic resistance is at least ten times greater than the first dynamic resistance.

3. The system of claim 1, further comprising a connector configured to detachably connect to a cable, a memory card, or a subscriber identification module (SIM) card, wherein the resistor is coupled between the connector and the integrated circuit.

4. The system of claim 1, wherein the shunt clamp comprises a silicon controlled rectifier (SCR).

5. The system of claim 1, wherein the shunt clamp comprises a Zener diode.

6. The system of claim 1, wherein the shunt clamp comprises a snap-back bipolar transistor.

7. The system of claim 1, wherein the substrate is a P-type substrate.

8. The system of claim 1, wherein a length of the N-well between the first N+ region and the second N+ region is equal to or less than 2.5 microns.

9. The system of claim 1, wherein an N-type doping density of the N-well is equal to or less than $10^{17}/cm^3$.

10. The system of claim 1, wherein the resistor further comprises:
one or more first contacts coupled to the first N+ region;
a first metal terminal coupled to the one or more first contacts;
one or more second contacts coupled to the second N+ region; and
a second metal terminal coupled to the one or more second contacts.

11. An electrostatic discharge (ESD) protection circuit, comprising:
a first input/output (I/O) pin;
a second I/O pin;
a shunt clamp coupled to the first I/O pin; and
a resistor coupled between the shunt clamp and the second I/O pin, wherein the resistor has a first dynamic resistance at a voltage of 100 millivolts across the resistor, the resistor has a second dynamic resistance at a voltage of three volts across the resistor, the second dynamic resistance is at least five times greater than the first dynamic resistance, and the resistor comprises:
a first N+ region on a substrate;
a second N+ region on the substrate; and
an N-well on the substrate, wherein at least a portion of the N-well is disposed between the first N+ region and the second N+ region, and a depth of the N-well is less than a depth of the first N+ region and less than a depth of the second N+ region.

12. The protection circuit of claim 11, wherein the second dynamic resistance is at least ten times greater than the first dynamic resistance.

13. The protection circuit of claim 11, wherein the shunt clamp comprises a silicon controlled rectifier (SCR).

14. The protection circuit of claim 11, wherein the shunt clamp comprises a Zener diode.

15. The protection circuit of claim 11, wherein the shunt clamp comprises a snap-back bipolar transistor.

16. The protection circuit of claim 11, wherein the resistor further comprises:
one or more first contacts coupled to the first N+ region;
a first metal terminal coupled to the one or more first contacts;
one or more second contacts coupled to the second N+ region; and
a second metal terminal coupled to the one or more second contacts.

* * * * *